METALLIC CONTACTS FOR SEMICONDUCTOR DEVICES

Filed Sept. 16, 1965 2 Sheets-Sheet 1

INVENTORS
A.H. Luxem
R.B. Small
BY John D. Bosham
ATTORNEY

Jan. 23, 1968 A. H. LUXEM ET AL 3,365,628

METALLIC CONTACTS FOR SEMICONDUCTOR DEVICES

Filed Sept. 16, 1965 2 Sheets-Sheet 2

INVENTORS
A. H. Luxem
R. B. Small

BY John D. Graham
ATTORNEY

United States Patent Office 3,365,628 Patented Jan. 23, 1968

3,365,628
METALLIC CONTACTS FOR SEMICONDUCTOR DEVICES

Allan H. Luxem and Richard B. Small, Dallas, Tex., assignors to Texas Instruments Incorporated, Dallas, Tex., a corporation of Delaware Filed Sept. 16, 1965, Ser. No. 487,856
10 Claims. (Cl. 317—234)

ABSTRACT OF THE DISCLOSURE

Disclosed is a dual metal contact for semiconductor devices having a first layer of iron adherent to and in contact with a surface of a semiconductor body through an aperture in an oxide layer on the surface of the body and a layer of gold overlying the iron layer.

This invention relates to semiconductor devices, and more particularly to metal contacts for transistors, semiconductor diodes, or the lie.

Electrical contacts to semiconductor devices must be composed of materials which have good chemical, electrical, thermal and mechanical properties when applied to semiconductor surfaces. While problems in making contacts exist for all semiconductors, the selection of contact material is especially difficult when the semiconductor is silicon, such as in planar transistors, in which silicon is most commonly used. In planar semiconductor devices, usually a silicon oxide or glass coating overlies the silicon surface except in the actual contact areas, this coating functioning to passivate the junctions and provide an insulating base for expanded contacts and interconnections. Accordingly, the contact material must exhibit good adherence to silicon and to silicon oxide or glass, but yet must not product any undesirable reactions with, nor penetrate, the silicon or oxide.

The most successful techniques thus far devised for the manufacture of semiconductor devices and particularly silicon transistors and integrated circuits, rely heavily upon photoengraving to form diffusion masks, define contact areas, etc., and upon evaporation to deposit the contact metals. Therefore, to be compatible with the most convenient manufacturing methods, the contact metal selected should permit the use of photo-masking and etching, and also should permit evaporation as a technique for deposition. These techniques for applying the contact material are most effective when very thin films are used, and since the other dimensions of the conductor are limited in size by the desired electrical characteristics of the device, the contact material must have a high conductivity to prevent the introduction of series resistance.

There is a continuing trend in semiconductor technology to fabricate devices operable at higher frequencies and capable of switching at higher speeds. Of necessity, the physical dimensions of the device must be made very small to provide these characteristics. For example, the part of the high frequency transistor which functions as the emitter region may occupy 1/10 square mill or less on the face of a semiconductor wafer, and may be only a few hundredths of a mil in depth. Connection cannot be made directly to such a region with a bonded wire; hence, the contact area must be expanded out over the oxide to make room for attaching an external lead, requiring the contact metal to be unreactive with the oxide coating on the silicon surface. In transistors of this type the oxide layer overlying the base region is very thin because of the short time during which the device can be held at temperatures which promote oxide growth. Typically, this oxide layer would be less than 2,000 A., compared to almost 10,000 A. over the collector region. Therefore, degradation of the device due to penetration of the contact metal to the junctions through the oxide would be particularly severe in high frequency devices. Also, the contact metal must not tend to penetrate into the semiconductor surface since slight penetration would obliterate the shallow regions.

The contact metal should not form an alloy with the semiconductor material at temperatures used in bonding leads to, or packaging, the device. Formation of such an alloy would result in the undesirable penetration into the shallow semiconductor regions. This limitation prevents the use of gold in direct contact with silicon because of its low eutectic temperature with silicon, 377° C., a temperature often exceeded in depositing contact metals, and bonding or hermetically sealing the device, in particular in the double plug sealing method. In like manner, the contact metal should not have a melting point below that temperature to which the device will be exposed in subsequent processing and operation.

An additional requirement for the contact metal is that it should provide an ohmic and low resistance contact to the semiconductor surface. If the device is made of silicon, particular problems occur because of the inherent properties of the silicon, its propensity for forming an oxide, etc. Moreover, if the contact metal used is a donor or acceptor in the semiconductor, it must have a low solubility so that the tendency to form a junction can be thwarted by heavy doping of the contact area.

With these requirements in mind, it is an object of this invention to provide improved contacts and interconnections for semiconductor devices, particularly silicon planar transistors and silicon diodes. Generally, the object is to use materials which do not tend to degrade semiconductor devices which lend themselves to manufacturing techniques compatible with other processes used on the devices, and which permit working with very small geometries. It is still a further object to provide a contact and interconnection arrangement for silicon devices which adheres well to silicon and to silicon oxide surfaces without reacting unfavorably therewith, which can be used with available photo-resist masking and etching procedures, and which forms an ohmic and low resistance electrical connection to silicon.

In accordance with these and other objects, features and improvements, the metallic contact system of the invention utilizes a thin layer of iron (Fe) as the bottom layer of a multi-layered contact. This thin layer of iron is then covered by a thin layer of a second metal, said second metal depending upon the special contact properties desired. Possible combinations would include a bottom layer of iron with a second layer of silver, gold, aluminum, platinum, palladium or nickel. The resulting multi-layer contact system is then so etched as to leave the desired pattern of contacts and interconnections on the silicon surface and on the oxide. Iron is used as the bottom layer because it exhibits excellent adherence properties to the silicon and silicon oxide layer, because it has a suitable conductivity, and because no electrical degradation of the device is noted after the application of the contact system according to the invention. In particular, a contact system combining iron and nickel is capable of withstanding high temperatures such as those required for the conventionally known method of double plug sealing for diodes and will remain mechanically and electrically stable during temperature cycling and electrical biasing. Using evaporated nickel as the upper layer also provides an excellent surface on which to plate electrolytic nickel for making a mesa contact structure. In addition to its utility for discrete components such as transistors and diodes, the contact system of the invention is also a suitable contact system for integrated semiconductor circuits.

The novel features believed to be characteristic of this invention are set forth in the appended claims. The invention itself, however, as well as other objects and advantages thereof, may best be understood by reference to the following detailed description of illustrative embodiments, read in conjunction with the appended claims and accompanying drawings, in which:

Figure 1:
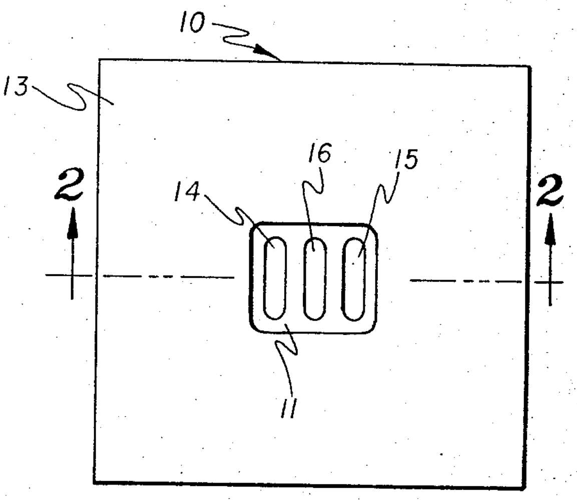
FIGURE 1 is a plan view of the wafer of semiconductor material having a planar transistor formed therein, with holes cut in the oxide coating for application of contacts.
Figure 2:
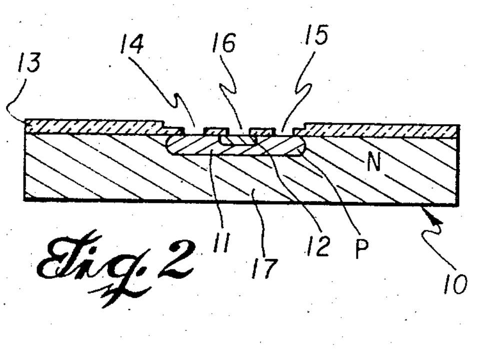
FIGURE 2 is an elevational view in section of the semiconductor wafer of FIGURE 1 taken along the line 2—2.

With reference to FIGURES 1 and 2, there is shown a semiconductor wafer 10 having a transistor formed therein including base and emitter regions 11 and 12, respectively, the remainder of the wafer providing the collector region 17. The transistor is formed by the planar technique, using successive diffusions with silicon oxide masking. This process leaves an oxide coating 13 on the top surface of the wafer, with the coating over the collector being thicker than over the base region, leaving the stepped configuration shown in FIGURE 2. For high frequencies, the geometry of the active part of the transistor is extremely small, the elongated emitter region 12 being perhaps 0.1 to 0.2 mil (0.0002 inch) wide and less than a mil long. The base region 11 is about 1 mil square. A pair of holes 14 and 15 is provided for the base contacts, and a hole 16 for the emitter contact, the latter hole being the same as used for the emitter diffusion. Due to the extremely small size of the actual base and emitter contact areas, one or two tenths of a mil in width, the contact must be expanded out over the silicon oxide 13 to facilitate bonding of leads for the base and other contacts, as will be explained below. It may be noted from FIGURE 3, that the thickness of the oxide coating 13 over the base region 11 is much less than over the collector region. Also, the shallow depth in diffused regions, particularly in the emitter region, may be seen. The large volume of metal compared to that of the oxide covered diffused regions emphasizes the problems which would be encountered if any reaction or alloying with the oxide of silicon occurred. The bulk of the wafer 10 forms a collector region 17, and the collector contact (not shown) may be applied to the lower face of the wafer. The size of the semiconductor wafer is selected for convience in handling, with a typical size for the wafer 10 being 30 mils on each side and 4 mils thick. Typically, the wafer 10 is merely a small undivided part of a large slice of silicon, perhaps 1 inch in diameter and 8 mils thick, during all the process steps described below, and this slice is scribed and broken into individual wafers, or diced only after the contacts are applied.

Figure 3:
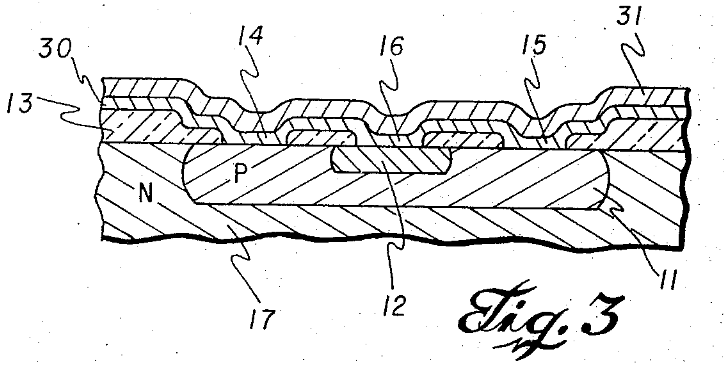
FIGURE 3 is an enlarged elevational view in section of a segment of the semiconductor wafer of FIGURE 1, also along the line 2—2, after contact material has been applied.

FIGURE 3 shows an enlarged sectional view of the diffused regions of semiconductor wafer 10 after the metal contact layers have been deposited but before each individual contact has been formed by conventional masking and etching techniques. The metal layers can be deposited by any conventional means such as resistance heating evaporation techniques. Layer 30 is the bottom layer of iron and is on the order of $10 \times 10^{-9}$ inch thick. One limitation on the thickness of said iron layer 30 is that it be continuous. Layer 31 is the upper contact layer which may be of any suitable oxidation resistant metal such as nickel, silver, gold, platinum or palladium. This layer will also be on the order of $10 \times 10^{-9}$ inch thick and continuous. The deposition of the second layer 31 should be made as soon as possible after the deposition of the iron layer 30, as one function of the upper layer is to prevent the iron layer 30 from becoming contaminated. The quicker protective layer 31 can be deposited, the less chance there is that any contamination of the lower layer 30 will occur.

Figure 4:
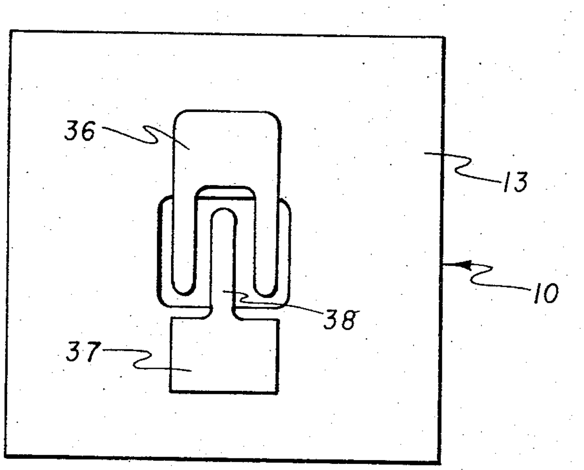
FIGURE 4 is a plan view of the transistor wafer of FIGURE 1 after the contacts and bonding pads have been formed.

Referring now to FIGURE 4, the completed contact system for the semiconductor planar transistor is seen, wherein selective portions of the layers 30 and 31 have been removed to achieve the desired contact arrangement. As shown in FIGURE 4, a base contact land or bonding pad 36 with two fingers or strips extends over the base collector junction into the base contact holes 14 and 15 (not shown). Likewise, an emitter contact land or bonding pad 37 has a single strip 38 extending over to make the emitter contact in hole 16 (not shown). The fingers or strips are very narrow, about 1 or 2 tenths of a mil or less, and so excellent definition or resolution is considered necessary. The pads 36 and 37 are large enough to allow bonding of 0.7 to 1.0 mil wires thereto. The formation of the shown collector and emitter bonding pads is accomplished by conventional photo-engraving techniques. A suitable etchant for the iron and nickel combination is a phosphoric acid solution comprised of 70 parts phosphoric acid, 15 parts acetic acid, 3 parts nitric acid and 12 parts deionized water. If gold is used as the second layer 31 it may be etched by a cyanide solution, a suitable solution being an aqueous solution of 60 grams per liter of Metex Aurostrip supplied by McDermid Inc., of Waterbury, Conn. The phosphoric acid solution mentioned above may then be used to etch the iron layer.

Figure 6:
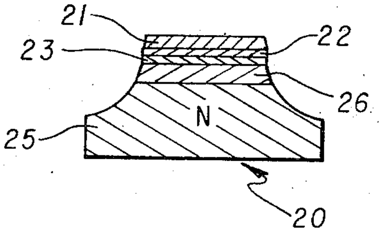
FIGURE 6 is a cross-sectional view of the semiconductor wafer shown in FIGURE 5 after a mesa contact system has been constructed thereon.

The mesa type contact system as illustrated in FIGURE 6 is suited for double plug sealing such as that described in copending application, "Glass Encapsulated Diffused Silicon Diode," Ser. No. 79,192, filed Dec. 29, 1960, now abandoned, in the names of John D. Peterson and Rodney A. Roques and assigned to the assignee of the instant application.

Figure 5:
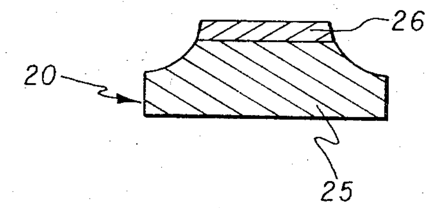
FIGURE 5 is a cross-sectional view of a semiconductor wafer having a diode formed therein.

Referring now to FIGURE 5, a semiconductor diode 20 is shown that is suitably prepared for the construction of a mesa contact system. Diode 20 may be composed of an N-type semiconductor substrate 25, such as silicon which has been suitably doped, into which a P-type region 26 is formed by diffusion. The configuration shown in FIGURE 5 is obtained by a conventional mesa etch technique.

FIGURE 6 is a cross-sectional view of the semiconductor diode of FIGURE 5 after a mesa contact arrangement according to the invention has been attached. Layer 23 is a thin layer of iron which is deposited by conventional techniques. Layer 22 is a thin layer of evaporated nickel. As mentioned above, layer 22 should be applied as soon as possible after layer 23 to prevent contamination of the iron layer 23. Layer 21 is electrolytic nickel that is plated onto layer 22. This is conventionally done by electrolysis. Layers 22 and 23 cover both the region 26 and the substrate 25 after evaporation, the configuration shown in FIGURE 6 being obtained by selectively etching said region and substrate.

Figure 7:
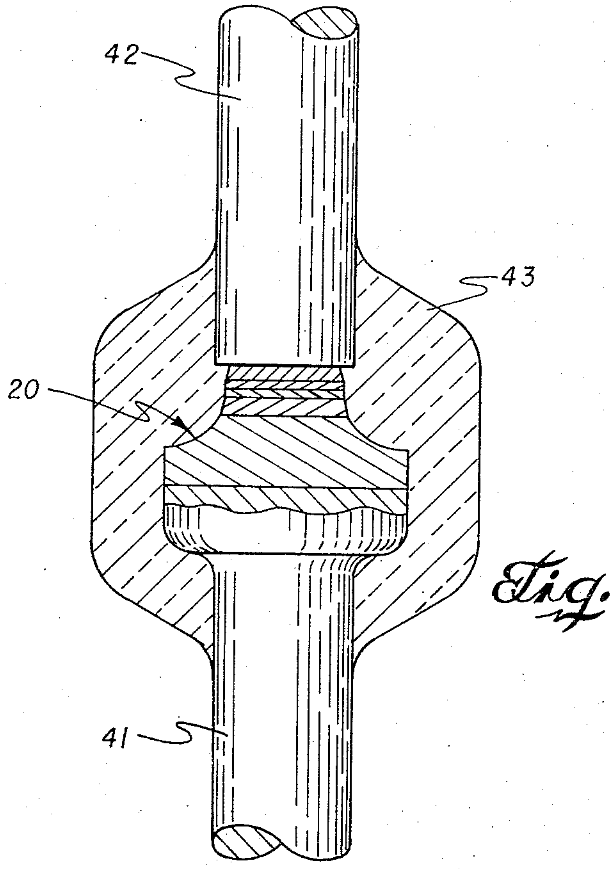
FIGURE 7 is a pictorial view of a double plug sealed diode, utilizing the contact system of the invention.

Referring now to FIGURE 7 the semiconductor device 20 as shown in FIGURE 6 is shown in encapsulated form, wherein 41 and 42 are lead wires which are bonded to semiconductor diode 20 by thermal-compression bonding, and 43 is a high temperature melting glass preferably Corning 0120 lead glass as referred to in co-pending application Ser. No. 79,192, filed Dec. 29, 1960, now abandoned.

Although the invention has been described with reference to specific methods and embodiments, it it to be understood that this description is not to be construed in a limiting sense. Various modifications of the disclosed embodiments, as well as other embodiments of the invention, will become apparent to persons skilled in the art without departing from the spirit and scope of the invention as defined by the appended claims.

What is claimed is:

1. A multi-layered contact arrangement for a semiconductor device comprising a thin layer of iron in direct contact with a surface of a semiconductor wafer, and a second conductive layer overlying said iron layer.

2. A multi-layered ohmic contact arrangement for a silicon device comprising a thin layer of iron in direct contact with a surface of a silicon wafer, and a second conductive, oxidation resistant layer overlying said iron layer and completely covering said iron layer.

3. A contact arrangement for a semiconductor device of the type including a silicon wafer having a region adjacent one face thereof with a P-N junction defining said region and other silicon of the wafer, said junction extending to said one face beneath a silicon oxide coating, said coating having a small opening over said region, the contact arrangement comprising a layer of iron in ohmic contact with the surface of said region through said opening in said silicon oxide coating, said layer of iron extending from said opening out over said silicon oxide coating in direct contact therewith and over the intersection of said junction with said one face to a position spaced from said region, and a layer of conductive, oxidation resistant material overlying said layer of iron.

4. A contact arrangement for a semiconductor device according to claim 3 wherein said conductive oxidation resistant material is selected from a group consisting of gold, silver, nickel, platinum and palladium.

5. A contact arrangement for a silicon diode of the type having a shallow region adjacent one face of a silicon wafer with a P-N junction between said region and the remaining silicon of the wafer, comprising a layer of iron in ohmic contact with the surface of said shallow region of said wafer, a second layer of conductive oxidation resistant metal overlying said layer of iron, and a third layer of metal overlying said second layer of metal.

6. The contact arrangement according to claim 5 wherein said conductive oxidation resistant material is selected from a group consisting of gold, silver, nickel, platinum and palladium.

7. A contact arrangement for a silicon device of the type having a plurality of regions in a silicon wafer thereby defining a plurality of P-N junctions, at least a portion of said junctions extending to one surface of said wafer, a silicon oxide layer overlying said one surface of said wafer, said silicon oxide layer having at least one hole exposing a portion of at least one of said regions, said contact arrangement comprising a layer of iron in ohmic contact with a portion of said at least one of said regions through said at least one hole, said layer of iron and extending over said silicon oxide layer and adhering to said silicon oxide layer, and a second layer of a material selected from the group consisting of gold, silver, nickel, platinum and palladium overlying said layer of iron.

8. A contact arrangement for silicon wafer according to claim 7 wherein said second layer completely covers said iron layer.

9. A semiconductor device comprising a silicon wafer having therein at least two regions of opposite conductivity type defining a rectifying junction therebetween, a contact arrangement for at least one of said regions comprising a layer of iron adhering directly to said at least one region, and a second layer of nickel overlying said iron layer.

10. A semiconductor device according to claim 9 wherein a third layer of electrolytic nickel overlies said second layer of nickel.

References Cited

UNITED STATES PATENTS

| | | | |
|---|---|---|---|
| 2,796,563 | 6/1957 | Ebers et al. | 317—234 |
| 2,887,627 | 5/1959 | Haas et al. | 317—241 |
| 2,973,571 | 3/1961 | Myering | 29—196 |
| 3,189,799 | 6/1965 | Moroney | 317—235 |
| 3,248,681 | 4/1966 | Reintgen | 29—196.6 X |
| 3,284,176 | 11/1966 | Reed et al. | 29—195 X |
| 3,290,570 | 12/1966 | Cunningham et al. | 317—234 |

JOHN W. HUCKERT, *Primary Examiner.*

R. F. POLISSACK, *Assistant Examiner.*